United States Patent [19]

La Fiandra et al.

[11] 4,425,038

[45] Jan. 10, 1984

[54] TECHNIQUE TO MODIFY WAFER GEOMETRY

[75] Inventors: Carlo F. La Fiandra, New Canaan; Burke E. Nelson, West Redding, both of Conn.

[73] Assignee: The Perkin-Elmer Corporation, Norwalk, Conn.

[21] Appl. No.: 312,488

[22] Filed: Oct. 19, 1981

[51] Int. Cl.³ .................................................. G03B 27/60
[52] U.S. Cl. .................................................. 355/73; 355/52
[58] Field of Search ............................ 355/73, 74, 75, 76, 355/52; 157/1.21; 72/292

[56] References Cited

U.S. PATENT DOCUMENTS

| 2,873,796 | 2/1959 | Riley | 157/1.21 |
| 2,889,870 | 6/1959 | Mulbarger | 157/1.21 |
| 3,599,699 | 8/1971 | Middleton | 157/1.21 |

Primary Examiner—Monroe H. Hayes
Attorney, Agent, or Firm—S. A. Giarratana; E. T. Grimes; T. P. Murphy

[57] ABSTRACT

Means and methods are provided for controlling the geometry changes in a wafer or mask to permit patterns on the wafer to be matched with projected patterns from the mask. A sealed chamber is provided to receive the edges of the wafer or mask. Pressure is applied from a pressure source into the chamber against the edges of the wafer or mask uniformly in all directions to produce compressive strains until the desired wafer or mask geometry is obtained.

9 Claims, 2 Drawing Figures

TECHNIQUE TO MODIFY WAFER GEOMETRY

BACKGROUND OF THE INVENTION

In a patent to Buckley et al, U.S. Pat. No. 4,068,947, entitled "Optical Projection and Scanning Apparatus", there is described apparatus and methods for photographically exposing an image receiving surface to a light image of an object. This patent illustrates one use of the present invention in which a mask is used to project a light image through an optical system to a wafer.

In the aforementioned patent in FIGS. 12–16, there is described a wafer comprising a light sensitive object which is exposed to a succession of light images in closely controlled relative positions. The position of the wafer is more closely controlled than the mask so that the successive exposures will be in the correct relative positions.

The various mechanisms for positioning the mask and wafer with respect to each other are described in the aforementioned patent and may also be utilized in practicing the present invention. Details shown and described in this patent with respect to positioning the wafer are not illustrated with only the features particularly relating to the present invention being illustrated and described. Generally, the operation relating to the apparatus involving the present invention takes place after the final positions of the mask and wafer have been established and prior to the reproductions of the images on the wafer.

OBJECTS OF THE INVENTION

It is an object of this invention to provide an improved system for producing controlled geometry changes in a thin circular element.

It is a further object of this invention to provide an improved system for producing controlled geometry changes in a thin circular element which is insensitive to the element edge configuration.

It is still a further object of this invention to provide an improved system for producing controlled geometry changes in a thin circular element which does not require precision parts.

It is still a further object of this invention to provide an improved system for producing controlled geometry changes in a wafer or mask which is insensitive to secant cuts in the wafer or mask.

BRIEF SUMMARY OF THE INVENTION

In accordance with the present invention, apparatus is provided for producing controlled geometry changes in a thin circular element such as a wafer or mask used for reproducing images projected onto the wafer. The edge of the wafer or mask is placed in a sealed chamber. Pressure is applied into the chamber against the edges of the wafer or mask uniformly in all radial directions. The pressure is sufficiently high to produce a compressive strain and deform the wafer or mask until the proper geometry of the wafer or mask is achieved. The pressure is maintained until the reproduction of the images projected from the mask is completed.

Other objects and advantages of the present invention will be apparent and suggest themselves to those skilled in the art, from a reading of the following specification and claims, taken in conjunction with the accompanying drawing.

DESCRIPTION OF THE INVENTION

While the description of the present invention is specific to changing the geometry of a silicon wafer, the invention is equally applicable to changing the geometry of any similar circular element which may include the projection mask or master.

Figure 1:
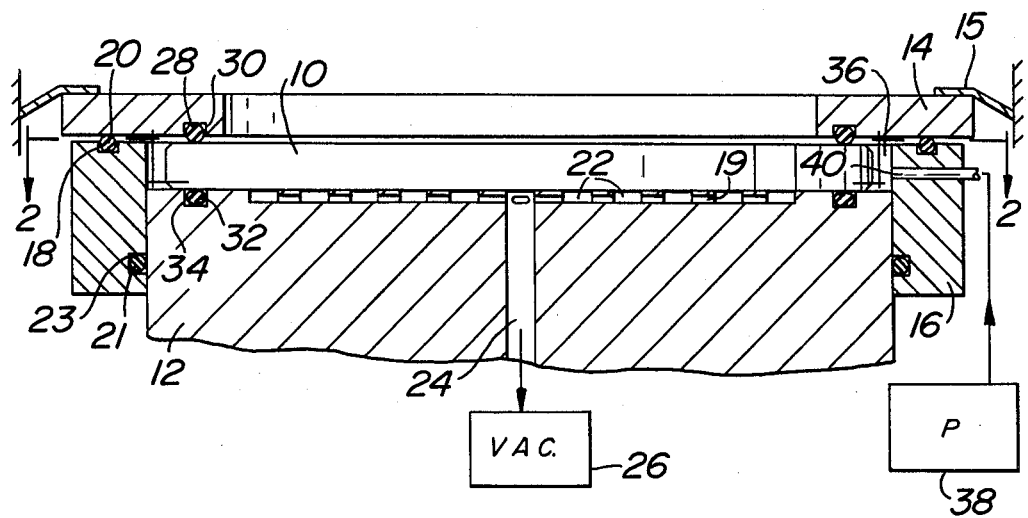
FIG. 1 is a partial broken-away view of apparatus for holding a wafer used for reproducing images projected from a mask.
Figure 2:
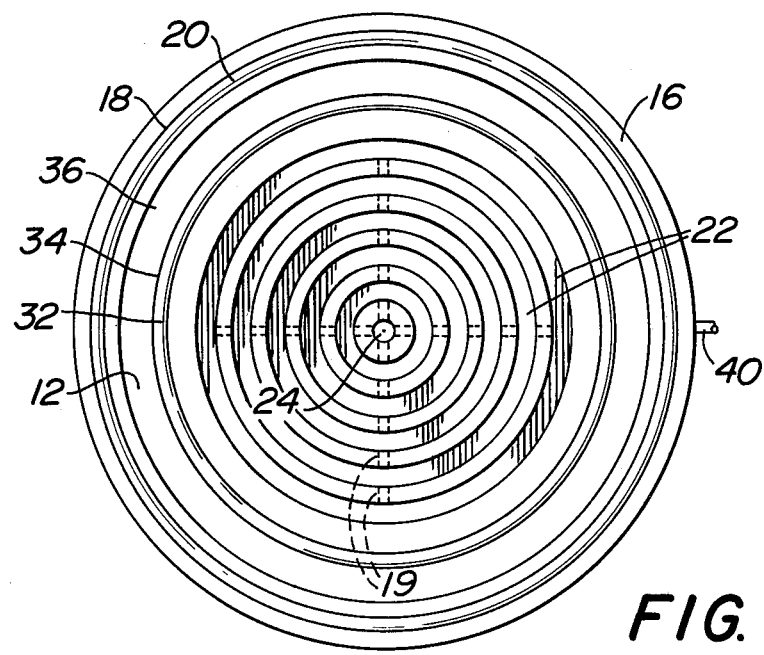
FIG. 2 is a cross-sectional view taken along lines 2—2 of FIG. 1.

Referring to FIGS. 1 and 2, a portion of a system, such as described in the aforementioned patent, comprises a wafer 10, which may be generally circular in shape. A movable platen 12 for holding the wafer is stressed by suitable spring means (not illustrated) against the wafer 10, which in turn is stressed against an adapter ring. The adapter ring 14 is supported by suitable spring means 15 which may be secured to the housing or the platen 12 for the system involved.

The platen 12 is guided and carried by a platen carrier 16. The platen carrier 16 includes a peripheral groove 18 for receiving a flexible "O" ring 20 therein. The ring 20 provides sealing between the adapter ring 14 and the platen carrier 16. A flexible "O" ring 21, disposed in a groove 23 of the platen carrier 16, provides sealing between the platen 12 and carrier 16.

The surface of the platen 12 is provided with vacuum grooves 22, interconnected by openings 19, all of which are connected through an opening 24 to a source of vacuum 26. The vacuum pressure holds the wafer 10 on the surface of the platen 12. Wafers of any given size may be supported or held by the vacuum pressure on the platen 12.

A seal is provided by a flexible "O" ring 28 disposed in a groove 30 of the adapter ring 14. The seal is provided on one side of the wafer in close proximity to the edge of the wafer 10. In like manner, a seal is provided by a flexible "O" ring 32 disposed in a groove 34 of the platen 12 and the opposite side of the wafer in close proximity to the edge of the wafer 10.

As a result of the sealing provided by the flexible "O" rings 20, 21, 28 and 34, a sealed pressure chamber 36 is provided around the outer edge of the wafer 10. In addition to the seal rings 20, 21, 28 and 34 and edge of the wafer, the sealed chamber comprises the adapter ring 14, the platen 12 and platen carrier 16.

A source of air pressure 38 is connected through an opening 40 into the chamber 36. The air pressure in the chamber 36 is applied to the edge of the wafer 10 to produce a compressive strain thereon. The amount of pressure from the source may be readily controlled to control the amount of compressive strain. The means for controlling such pressure may include suitable valves or other well known devices, not illustrated. As a result of the pressure applied to the edge of the wafer 10, when the pressure is sufficiently high, a controlled compression or deflection of the wafer may be achieved. Such controlled compressions or deflections are fast acting and insensitive to the edge configuration of the wafer 10. Different deformations of the wafer 10 may be achieved by varying the applied pressure from the source 38.

When the pressure is applied to the chamber 36, a pure radial load is exerted against the edge of the wafer 10 regardless of the edge geometry because the pressure acts uniformly in all directions. Thus, the system is insensitive to clipping, secant cuts, chamfers and the like in the wafer.

During operation, when it is time to match patterns projected from a mask to the wafer, pressure from the source 38 is applied to the chamber 36. At the proper pressure levels, the wafer will deform until the desired geometry is achieved, such as when the patterns on the wafer match those projected from the mask. The pressure achieving the proper geometry of the wafer is maintained until the exposures on the wafer 10 are completed.

The apparatus for deforming the wafer in accordance with the present invention is relatively fast acting. In addition, the pressure seal for the chamber acts as a stabilizer.

In practicing the present invention, the pressure applied to the chamber 36 must be sufficient to deform the wafer 10. For example, for a typical silicon wafer approximately 5 in diameter having a thickness of 0.020 inches, the pressure applied may range between 370 and 416 psi dependent on the amount of deformation of the wafer desired.

What is claimed is:

1. In a photolithographic system apparatus for producing controlled geometry change in a thin circular element,
    an adapter ring,
    a movable platen supporting said circular element and biased to urge said element against said adapter ring,
    vacuum means in said platen for securing said element to said platen,
    a platen carrier fixed to said platen for guiding said platen,
    the edge of said element, said adapter ring, said platen and said platen carrier forming a chamber,
    means for sealing said chamber making it airtight,
    means for introducing air into said chamber to apply pressure against the edge of said element in all radial directions to cause deformation of said element.

2. Apparatus as set forth in claim 1 wherein said pressure applied to said chamber is selectively controllable to produce different deformations of said element.

3. Apparatus as set forth in claim 1 wherein said means for sealing include a first flexible seal ring disposed set between one side of said element in close proximity to the outer edge thereof and said adapter ring and a second flexible seal ring disposed between the opposite side of said element in close proximity to the outer edge thereof and said platen.

4. Apparatus as set forth in claim 3 wherein a third flexible seal ring is disposed between said platen carrier and said adapter ring.

5. Apparatus as set forth in claim 4 wherein a fourth flexible seal ring is disposed between said platen and said platen carrier.

6. Apparatus as set forth in claim 5 wherein spring means are provided to retain said adapter ring against said first flexible seal ring.

7. Apparatus as set forth in claim 6 wherein vacuum means includes a plurality of annular vacuum grooves on the surface of said platen to hold said element.

8. Apparatus as set forth in claims 1, 2, 3, 4, 5, 6 or 7 wherein said element is a wafer.

9. Apparatus as set forth in claims 1, 2, 3, 4, 5, 6 or 7 wherein said element is a projection mask.

* * * * *